(12) United States Patent
Gao et al.

(10) Patent No.: US 7,197,058 B2
(45) Date of Patent: Mar. 27, 2007

(54) SEMICONDUCTOR LASER APPARATUS

(75) Inventors: Xin Gao, Hamamatsu (JP); Yujin Zheng, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 272 days.

(21) Appl. No.: 11/018,573

(22) Filed: Dec. 22, 2004

(65) Prior Publication Data

US 2005/0169335 A1 Aug. 4, 2005

(30) Foreign Application Priority Data

Dec. 24, 2003 (JP) ............................ P2003-427804

(51) Int. Cl.
*H01S 5/00* (2006.01)
*H01S 3/08* (2006.01)
*H01S 3/082* (2006.01)

(52) U.S. Cl. ........................ 372/49.01; 372/97; 372/99

(58) Field of Classification Search ............... 372/49.01
See application file for complete search history.

(56) References Cited

U.S. PATENT DOCUMENTS

| 5,386,426 A | 1/1995 | Stephens |
| 5,513,201 A | 4/1996 | Yamaguchi et al. |
| 6,584,133 B1 | 6/2003 | Walker et al. |

FOREIGN PATENT DOCUMENTS

| JP | 56-073485 | 6/1981 |
| JP | 05-048200 | 2/1993 |
| JP | 06-196779 | 7/1994 |
| JP | 06-244505 | 9/1994 |
| JP | 06-252489 | 9/1994 |
| JP | 2723045 | 11/1997 |
| JP | 3071360 | 5/2000 |
| JP | 2000-200940 | 7/2000 |

*Primary Examiner*—Armando Rodriguez
(74) *Attorney, Agent, or Firm*—Drinker Biddle & Reath LLP

(57) ABSTRACT

A semiconductor laser apparatus capable of reducing a spread angle of emission light with downsizing has an active region between first and second end surfaces. A first reflection structure and a partial reflection structure are provided on the first end surface side. The end surface of the active region is divided into a total reflection region and a partial reflection region in combination with the first reflection structure and partial reflection structure. A laser resonator includes the first reflection structure and partial reflection structure. A second reflection structure is positioned on the way of a resonance optical path of the laser resonator. Light emitted within the active region propagates on a resonance optical path. An induction emission is produced. The semiconductor laser carries out a laser oscillation. Of the light arriving at the partial reflection structure, the portion transmitted through the partial reflection structure is outputted outside the apparatus.

8 Claims, 11 Drawing Sheets

SEMICONDUCTOR LASER APPARATUS

BACKGROUND OF THE INVENTION

1. Field of the Invention

The present invention relates to a semiconductor laser apparatus including an active region that emits light having a predetermined wavelength as a semiconductor light-emitting device.

2. Related Background Art

A laser diode that is a semiconductor light-emitting element has a light-emitting active region between a first end surface and a second end surface facing each other. A partial reflection film is formed on the first surface side, while a total reflection film is formed on the first end surface side. A laser resonator is constituted between these partial and total reflection films. Namely, the light emitted in the active region is totally reflected at the total reflection film, and partially reflected at the partial reflection film. The emitted light goes and returns in the laser resonator constructed by these partial and total reflection films, and at this time an induction emission is produced. Thus, a laser oscillation of the laser diode is carried out. Then, part of the light reached from the active region to the partial reflection film is reflected by the partial reflection film, while the remainder transmits the partial reflection film. The light transmitted in the partial reflection film serves as an output laser beam.

Since such a laser beam outputted from the laser diode has a large spread angle, it cannot be immediately applied to a variety of purposes. For this reason, as disclosed in Japanese Patent No.3071360, an optical element such as a lens or an optical path conversion element is used together with the laser diode to collimate the laser beam outputted from the laser diode. Thus, in the semiconductor laser apparatus including the foregoing laser diode and optical element, the laser beam outputted from the laser diode may have a small spread angle due to an operation of the optical element such as a lens and an optical path conversion element even if the emission light originally has a large spread angle.

SUMMARY OF THE INVENTION

After studying a conventional semiconductor laser apparatus, the inventors found out the following problems.

That is, irrespective of a laser diode itself of small size, a conventional semiconductor laser apparatus includes an optical element in addition to the laser diode, resulting in an enlarged apparatus size. In particular, in the cases of a laser diode array and a laser diode array stack that are integrated in a state that plural laser diodes are arranged in an array, the apparatus size of the semiconductor laser apparatus is further enlarged.

The present invention is made to overcome the aforementioned problems, and it is an object to provide a semiconductor laser apparatus capable of reducing a spread angle of an emission light with downsizing.

A semiconductor laser apparatus according to the present invention comprises a first end surface and a second end surface facing each other, an active region disposed between these first and second end surfaces, a first reflection structure and a partial reflection structure disposed on the side of the first end surface, and a second reflection structure disposed on the side of the second end surface. The active region is a region that emits light having a predetermined wavelength and extends along a first direction. The first reflection structure totally reflects the light having propagated through the active region. The partial reflection structure transmits part of the light having propagated through the active region and reflects the remainder thereof. A laser resonator is constituted by these first reflection structure and partial reflection structure. An end surface of the active region corresponding with the first end surface is divided into a total reflection region and a partial reflection region not overlapping with each other in combination with the first reflection structure and partial reflection structure. Further, the second reflection structure totally reflects the light having propagated through the active region. The second reflection structure is provided on the way of a resonance optical path of the laser resonator constituted by the first reflection structure and partial reflection structure.

In the semiconductor laser apparatus according to the present invention, the light emitted in the active region propagates through the active region, and the light arrives at the first reflection structure, the second reflection structure, or the partial reflection structure. The light arrived at the first reflection structure from the active region is totally reflected by the first reflection structure. The light reflected by the first reflection structure arrives at the second reflection structure after propagating through the active region. The light arrived at the second reflection structure from inside the active region is totally reflected by the second reflection structure. Then, the light reflected by the second reflection structure arrives at the first reflection structure or the partial reflection structure after propagating through the active region. At this time, among the light having arrived at the partial reflection structure, part having transmitted through the partial reflection structure is outputted to the outside of the semiconductor laser apparatus, while the remainder reflected by the partial reflection structure arrives at the second reflection structure again after propagating through the active region. Thus, while the reflected light from the above structures propagates, an induction emission is produced, thereby producing a laser oscillation. In such a way, among the light arrived at the partial reflection structure from the active region, the light transmitted in the partial reflection region serves as an output laser beam.

In the semiconductor laser apparatus according to the present invention, it is preferable that the end surface of the active region corresponding with the first end surface has a shape such that a width of a second direction orthogonal to the first direction is longer than that of a third direction orthogonal to both the first direction and the second direction. Meanwhile, it is preferable that the total reflection region and partial reflection region divided at the end surface of the active region corresponding with the first end surface are aligned along the second direction. This construction is adapted to dispose the first reflection structure and partial reflection structure on the first end surface side.

In addition, in the semiconductor laser apparatus according to the present invention, it is preferable that the end surface of the active region corresponding with the first end surface is wider than that of the active region corresponding with the second end surface. Namely, a section orthogonal to the first direction in the active region narrows from the first end surface toward the second end surface.

More specifically, it is preferable that in a region of the active region through which light totally reflected at a reflection angle of zero degree by the first reflection structure, among the light reaches to the second reflection structure, passes, the region has a shape such that a sectional area on the second end surface side is narrower than that on the first end surface side. In this case, a vertical resonance between the first reflection structure and second reflection structure is suppressed, and a laser resonance between the first reflection structure and partial reflection structure is produced efficiently. As a result, the power of the laser beam outputted from the partial reflection structure is intensified.

On the other hand, in a region of the active region through which light reflected at a reflection angle of zero degree by the partial reflection structure, among the light reaches to the second reflection structure, passes, the region may have a shape such that a sectional area on the second end surface side is narrower than that on the first end surface side. Also, in this case, a vertical resonance between the partial reflection structure and second reflection structure is suppressed, and a laser resonance between the first reflection structure and partial reflection structure is produced efficiently. As a result, the power of the laser beam outputted from the partial reflection structure is intensified.

Further, in the semiconductor laser apparatus according to the present invention, there may be provided a plurality of waveguide regions each having a similar construction to the aforementioned active region as a semiconductor light-emitting device. Each of the plural waveguide regions extends along the first direction and emits light having a predetermined wavelength. Meanwhile, preferably, an end surface corresponding with the first end surface of each of the plural waveguide regions is divided into a total reflection region and a partial reflection region in combination with the first reflection structure and the partial reflection structure, and the plural waveguide regions are one-dimensionally arranged in an array so that these end surfaces are aligned along the second direction. However, the plural waveguide regions may be two-dimensionally arranged in an array so that these end surfaces are aligned along the second direction and stacked along the third direction.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of a semiconductor laser apparatus according to the present invention will be explained in detail with reference to FIGS. 1 to 11. In the explanation of the drawings, the same elements will be denoted by the same reference symbols and these redundant descriptions will be omitted. Note that the drawings each are represented with a xyz rectangular coordinate system for the sake of explanation.

First Embodiment

Figure 1:
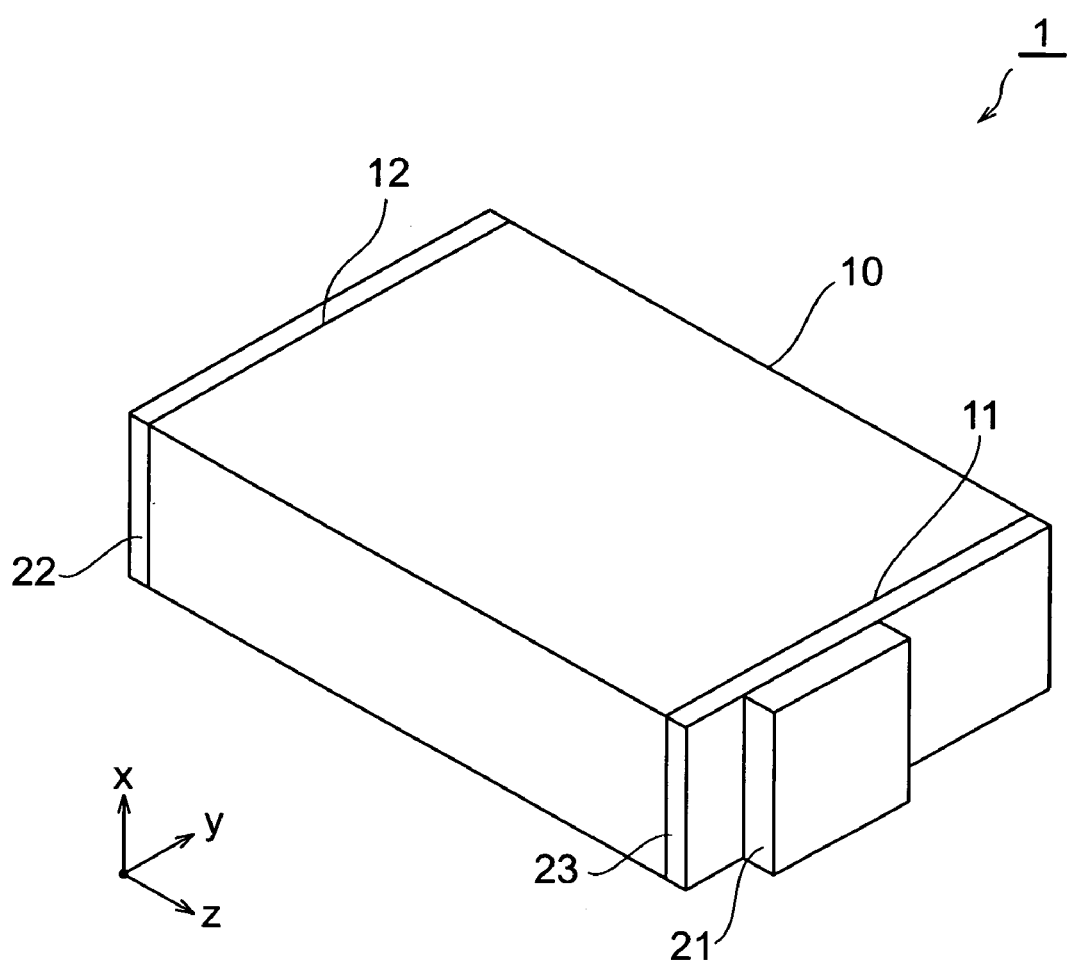
FIG. 1 is a perspective view showing a construction of a first embodiment of a semiconductor laser apparatus according to the present invention.
Figure 2:
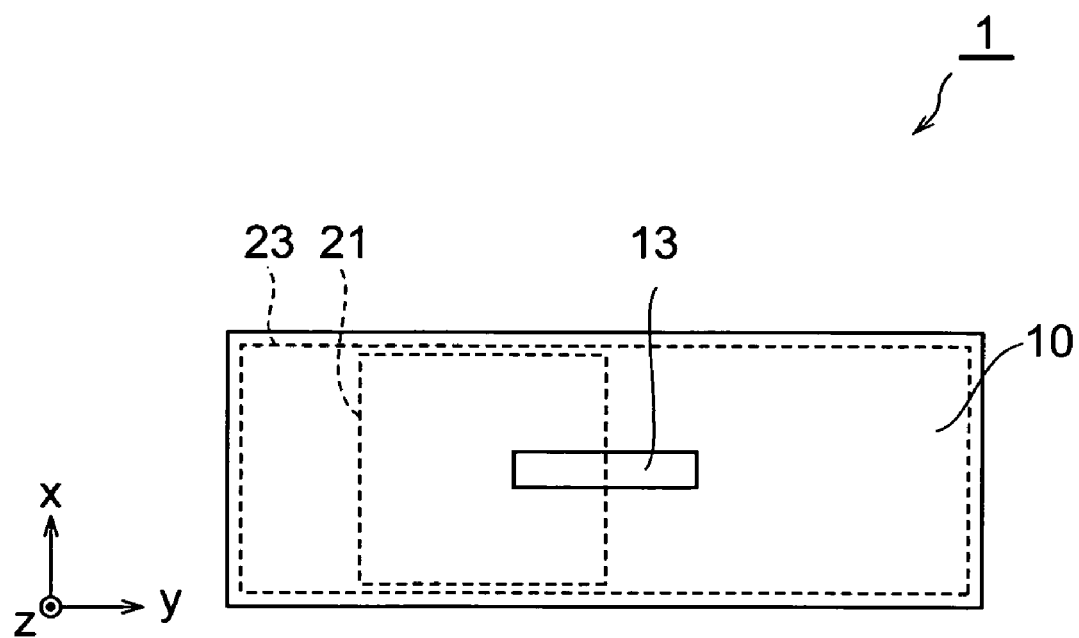
FIG. 2 is a front view showing the construction of the first embodiment of the semiconductor laser apparatus according to the present invention.
Figure 3:
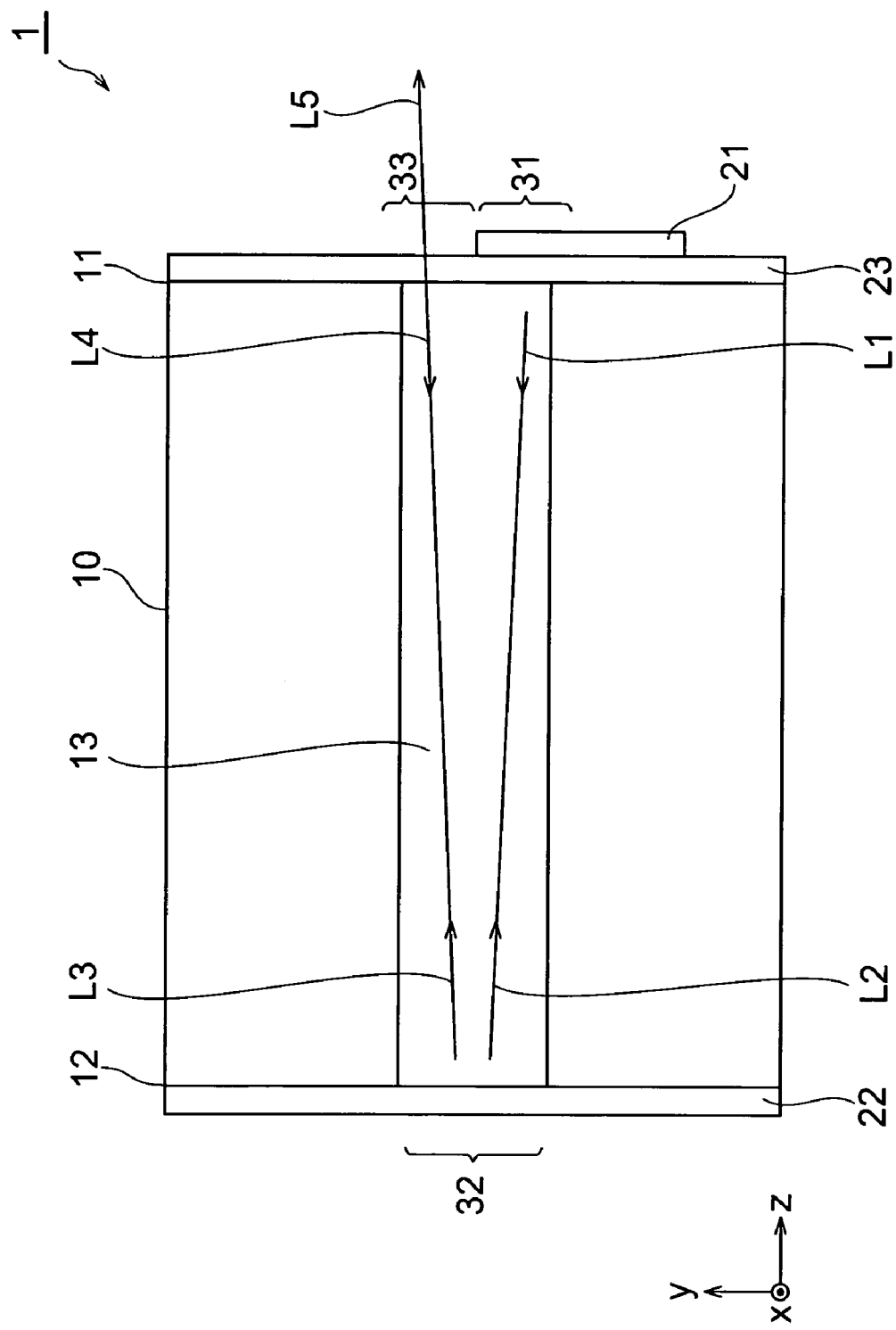
FIG. 3 is a cross-sectional view showing the construction of the first embodiment of the semiconductor laser apparatus according to the present invention.

A first embodiment of a semiconductor laser apparatus according to the present invention will be first explained below. FIG. 1 is a perspective view showing a construction of the first embodiment of the semiconductor laser apparatus according to the present invention. FIG. 2 is a front view showing the construction of the first embodiment of the semiconductor laser apparatus according to the present invention. FIG. 3 is a cross-sectional view showing the construction of the first embodiment of the semiconductor laser apparatus according to the present invention.

A semiconductor laser apparatus 1 according to the first embodiment includes a semiconductor light-emitting device 10 having a light emitting active region 13 between a first end surface 11 and a second end surface 12 facing each other. A first reflection film 21 included in a first reflection structure and a partial reflection film 23 included in a partial reflection structure are formed on the side of the first end surface 11 of the semiconductor light-emitting device 10, while a second reflection film 22 included in a second reflection structure is formed on the side of the second end surface 12 thereof. The first end surface 11 and second end surface 12 each are in parallel to the xy-plane. In addition, the first and second reflection films 21, 22 are total reflection films.

FIG. 2 is a front view of the semiconductor laser apparatus 1 as the first end surface 11 is seen along the z-axis direction. As shown in FIG. 2, the layers in the semiconductor light-emitting device 10 is stacked in the x-axis direction, and the xy-section of the active region 13 has a shape such that a width of the y-axis direction (second direction) orthogonal to both of the z-axis and x-axis is longer than that of the x-axis direction (third direction) orthogonal to the z-axis (first direction) extended by the active region 13. The partial reflection film 23 is formed to cover the whole surface and its periphery of the active region 13 on the first end surface 11, and the first reflection film 21 is formed outside the partial reflection film 23 to cover part of the active region 13 on the first end surface 11. The second reflection film 22 is formed to cover the whole surface and its periphery of the active region 13 on the second end surface 12. These are composed of dielectric multilayer films. Or, the first reflection film 21 and second reflection film 22 each are formed of a metallic film. Each reflectance of the first reflection film 21 and second reflection film 22 that totally reflect arrived light is 90% or more, preferably substantially 100%. The reflectance of the partial reflection film 23 is 3–15%.

FIG. 3 is a view showing a yz-section including the active region 13 of the semiconductor laser apparatus 1. As shown in FIG. 3, at the first end surface 11, a portion overlapping with the active region 13 in the first reflection film 21 constitutes a first total reflection region 31, while a portion not overlapping with the first reflection film 21 in the partial reflection film 23 constitutes a partial reflection region 33. At the second end surface 12, a portion overlapping with the active region 13 in the second reflection film 22 constitutes a second total reflection region 32. In the laser apparatus 1 according to the first embodiment, a thickness of the active region 13 in the x-axis direction is constant along the z-axis direction, and a width of the active region 13 in the y-axis direction is also constant along the z-axis direction.

A specific dimension of the laser apparatus 1 according to the first embodiment is as follows. A thickness of the whole semiconductor light-emitting device 10 in the x-axis direction is 100–150 µm; a width of the whole semiconductor light-emitting device 10 in the y-axis direction is 500–1000 µm; a length of the whole semiconductor light-emitting device 10 in the z-axis direction is 0.5–2 mm. A thickness of the active region 13 in the x-axis direction is 1 µm, and a width of the active region 13 in the y-axis direction is 100–500 µm. At the first end surface 11, a width of an overlapping portion of the active region 13 and the first reflection film 21 in the y-axis direction is 40–250 µm.

In the laser apparatus 1 according to the first embodiment, a laser resonator is constituted between the first total reflection region 31 and partial reflection region 33. Namely, the light emitted within the active region 13 propagates in the active region 13, and then reaches the first total reflection region 31, second total reflection region 32, or partial reflection region 33. The light reached from inside the active region 13 to the first total reflection region 31 is reflected by the first total reflection region 31. The light L1 reflected by the first total reflection region 31 reaches the second total reflection region 32 after propagation inside the active region 13. The lights L2, L3 reflected by the second total reflection region 32 reach the first total reflection region 31 or partial reflection region 33 after propagation inside the active region 13. Here, among the lights reached from inside the active region 13 to the partial reflection region 33, the light L4 reflected by the partial reflection region 33 reaches the second total reflection region 32 again after propagation in the active region 13, while the light L5 transmitted in the partial reflection region 33 is outputted outside the semiconductor laser apparatus 1.

In such a way, the laser resonator is constituted between the first total reflection region 31 and partial reflection region 33, and the second total reflection region 32 is positioned on the way of the resonance optical path. Therefore, an induction emission is produced in the active region 13, and the laser apparatus 1 performs a laser oscillation. As a result, among the lights reached from the active region 13 to the partial reflection region 33, the light transmitted in the partial reflection region 33 serves as an output laser beam.

As described above, in the semiconductor laser apparatus 1 according to the first embodiment, the laser beam outputted from the partial reflection region 33 has a certain spread angle. In the spread angle, a spread angle in the y-axis direction is reduced ½ to ¼ as compared with that of the emission light from a conventional laser diode in the y-axis direction. In addition, the semiconductor laser apparatus 1 according to the first embodiment can output a laser beam having a small spread angle in the y-axis direction without using an optical element such as an optical path conversion element and/or a lens for collimating an emission light emitted from a laser diode, thereby achieving downsizing. Further, when the size of the active region 13 is the same level as that of a conventional laser diode, the area of a laser-beam emitting portion (partial reflection region 33 in the first embodiment) is narrower than that of the emitting portion of the conventional laser diode, resulting in enhancing the power density of the laser beam outputted from the semiconductor laser apparatus 1.

Second Embodiment

Figure 4:
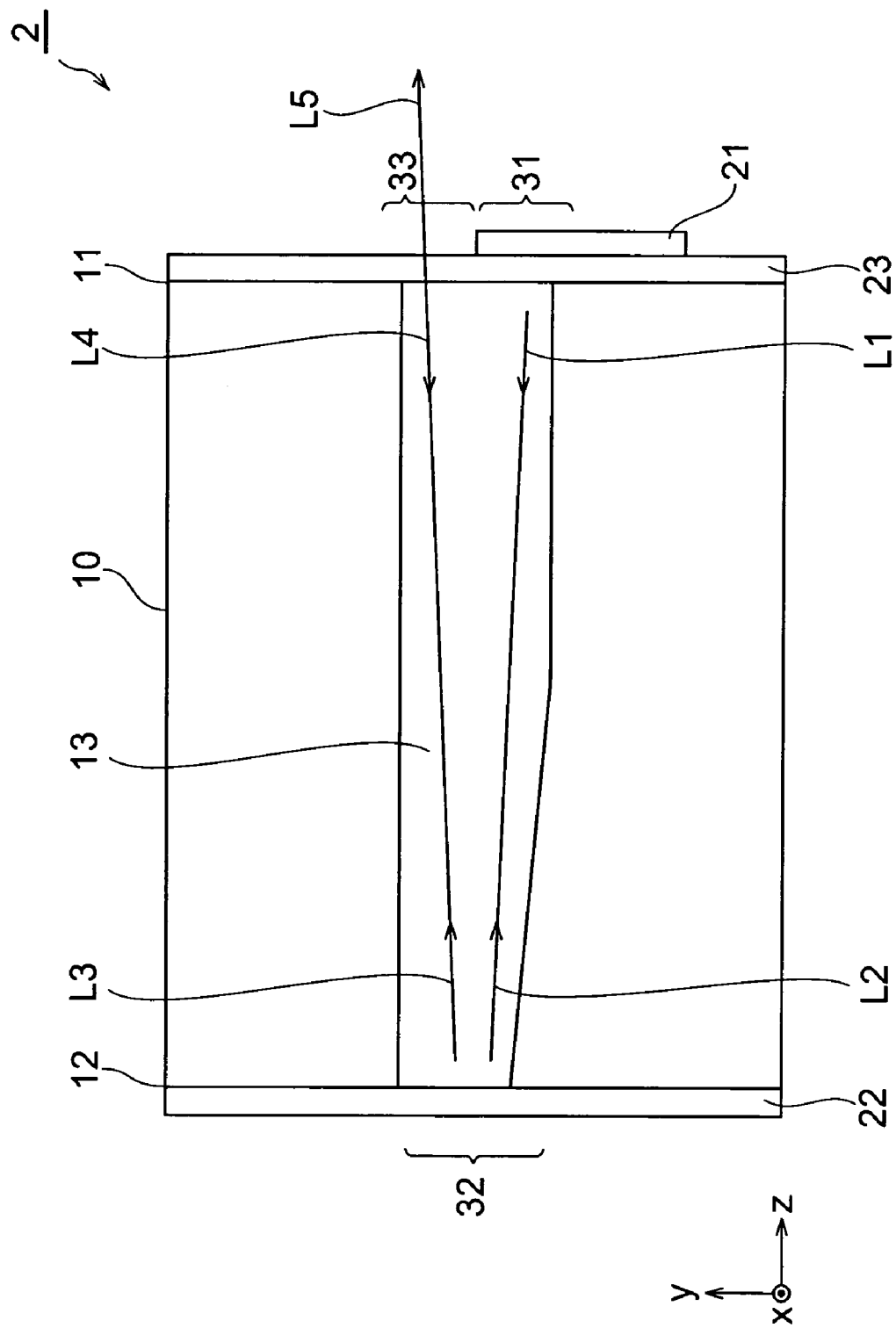
FIG. 4 is a cross-sectional view showing a construction of a second embodiment of the semiconductor laser apparatus according to the present invention.

A second embodiment of the semiconductor laser apparatus according to the present invention will be next explained below. FIG. 4 is a cross-sectional view showing a construction of the second embodiment of the semiconductor laser apparatus according to the present invention. Note that the appearance of a semiconductor laser apparatus 2 according to the second embodiment is similar to that of the semiconductor laser apparatus 1 according to the foregoing first embodiment (see FIGS. 1 and 2).

As shown in FIG. 4, at a first end surface 11 a portion overlapping with an active region 13 in a first reflection film 21 constitutes a first total reflection region 31, while a portion not overlapping with the first reflection film 21 in a partial reflection film 23 constitutes a partial reflection region 33. At a second end surface 12 a portion overlapping with the active region 13 in a second reflection region 22 constitutes a second total reflection region 32.

At the semiconductor laser apparatus 2 according to the second embodiment, a thickness of the active region 13 in the x-axis direction is constant along the z-axis direction, while a width of the active region 13 in the y-axis direction is narrower on the side of the second end surface 12 rather than the side of the first end surface 11. Particularly, when this matter is geometrically considered, in a region of the active region 13 through which light reflected in the first total reflection region 31 at a reflection angle of zero degree, among the light reaches to the second total reflection region 32, passes, a width on the second end surface 12 side is narrower than that on the first end surface 11 side. In this respect, there is a difference from the case of the first embodiment. The width of the active region 13 may change over the whole range along the z-axis direction, or may change in the only partial range along the z-axis direction.

A laser resonator is constituted between the first total reflection region 31 and partial reflection region 33 also in the semiconductor laser apparatus 2 according to the second embodiment as well as the case of the first embodiment, and the second total reflection region 32 is positioned on the way of the corresponding resonance optical path. Thus, an induction emission is produced in the active region 13, and thereby the laser apparatus 2 carries out a laser oscillation. As a result, among the lights reached from the active region 13 to the partial reflection region 33, the lights transmitted through the partial reflection region 33 serves as an output laser beam.

The semiconductor laser apparatus 2 according to the second embodiment brings the following effects in addition to the similar effects to the case of the first embodiment. That is, in the semiconductor laser apparatus 2 according to the second embodiment, the active region 13 has the aforementioned cross-sectional shape, thereby suppressing vertical resonance between the first total reflection region 31 and partial reflection region 33. As a result, resonance between the first total reflection region 31 and partial reflection region 33 is produced efficiently. The power of the laser beam outputted from the partial reflection region 33 can be intensified. In addition, a spread angle of the laser beam outputted from the partial reflection region 33 toward the y-axis direction can be further reduced.

Third Embodiment

Figure 5:
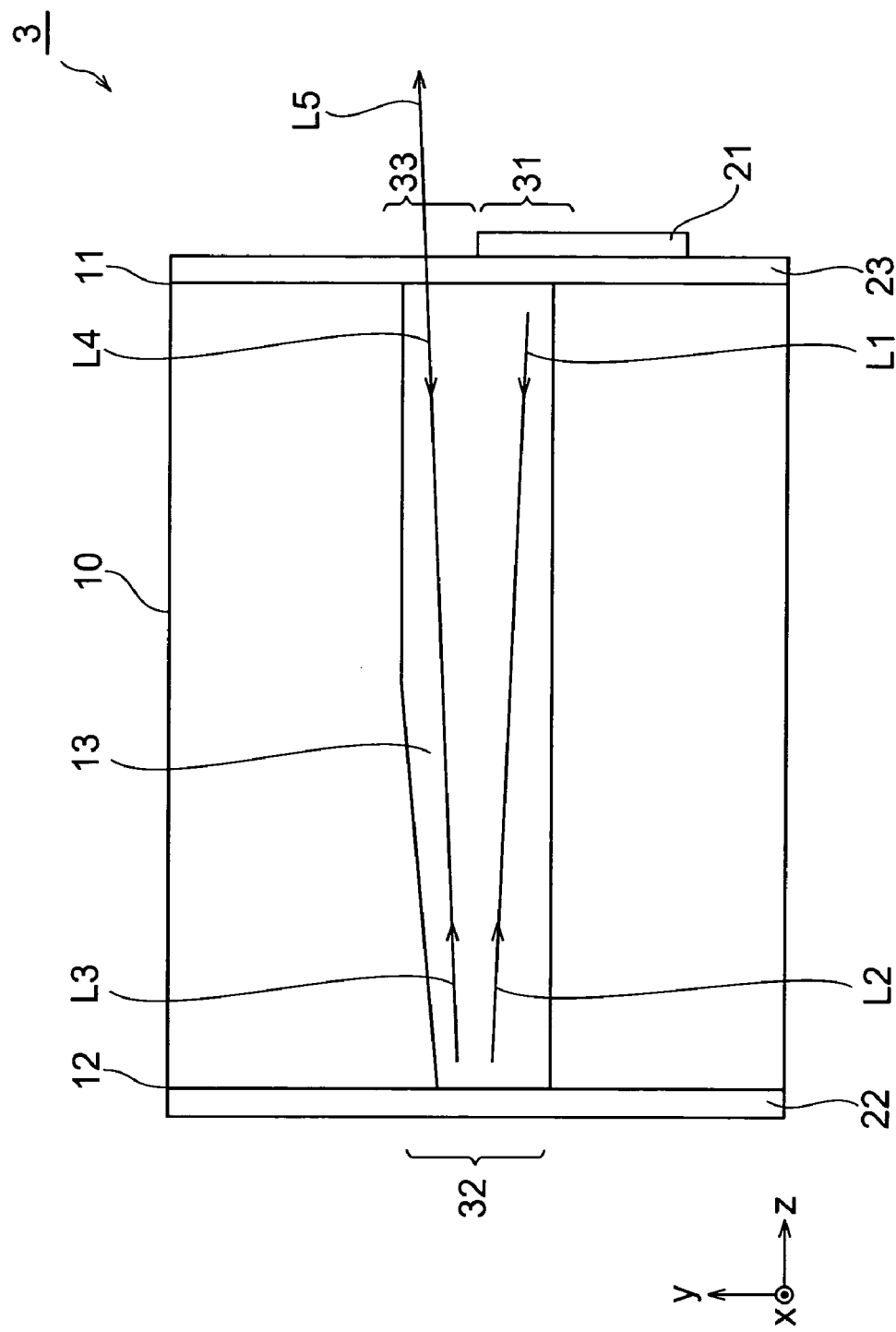
FIG. 5 is a cross-sectional view showing a construction of a third embodiment of the semiconductor laser apparatus according to the present invention.

A third embodiment of the semiconductor laser apparatus according to the present invention will be next explained below. FIG. 5 is a cross-sectional view showing a construction of the third embodiment of the semiconductor laser apparatus according to the present invention. Note that the appearance of a semiconductor laser apparatus 3 according to the third embodiment is similar to that of the semiconductor laser apparatus 1 according to the aforementioned first embodiment (see FIGS. 1 and 2).

As shown in FIG. 5, at a first end surface 11 a portion overlapping with an active region 13 in a first reflection film 21 constitutes a first total reflection region 31, while a portion not overlapping with the first reflection region 21 in a partial reflection film 23 constitutes a partial reflection region 33. At a second end surface 12 a portion overlapping with the active region 13 in a second reflection region 22 constitutes a second total reflection region 32.

At the semiconductor laser apparatus 3 according to the third embodiment, a thickness of the active region 13 in the x-axis direction is constant along the z-axis direction, while a width of the active region 13 in the y-axis direction is narrower on the side of the second end surface 12 rather than the side of the first end surface 11. Particularly, when this matter is geometrically considered, in a region of the active region 13 through which light reflected in the partial reflection region 33 at a reflection angle of zero degree, among the light reaches to the second total reflection region 32, passes, a width on the second end surface 12 side is narrower than that on the first end surface 11 side. In this respect, there is a difference from the case of the first embodiment. The width of the active region 13 may change over the whole range along the z-axis direction, or may change in the only partial range along the z-axis direction.

A laser resonator is constituted between the first total reflection region 31 and partial reflection region 33 also in the semiconductor laser apparatus 3 according to the third embodiment as well as the case of the first embodiment, and the second total reflection region 32 is positioned on the way of the corresponding resonance optical path. Thus, an induction emission is produced in the active region 13, and thereby the laser apparatus 3 carries out a laser oscillation. As a result, among the lights reached from the active region 13 to the partial reflection region 33, the lights transmitted through the partial reflection region 33 serves as an output laser beam.

The semiconductor laser apparatus 3 according to the third embodiment brings the following effects in addition to the similar effects to the case of the first embodiment. That is, in the semiconductor laser apparatus 3 according to the third embodiment, the active region 13 has the aforementioned cross-sectional shape, thereby suppressing vertical resonance between the first total reflection region 31 and partial reflection region 33. As a result, resonance between the first total reflection region 31 and partial reflection region 33 is produced efficiently. The power of the laser beam outputted from the partial reflection region 33 can be intensified. In addition, a spread angle of the laser beam outputted from the partial reflection region 33 toward the y-axis direction can be further reduced.

Fourth Embodiment

Figure 6:
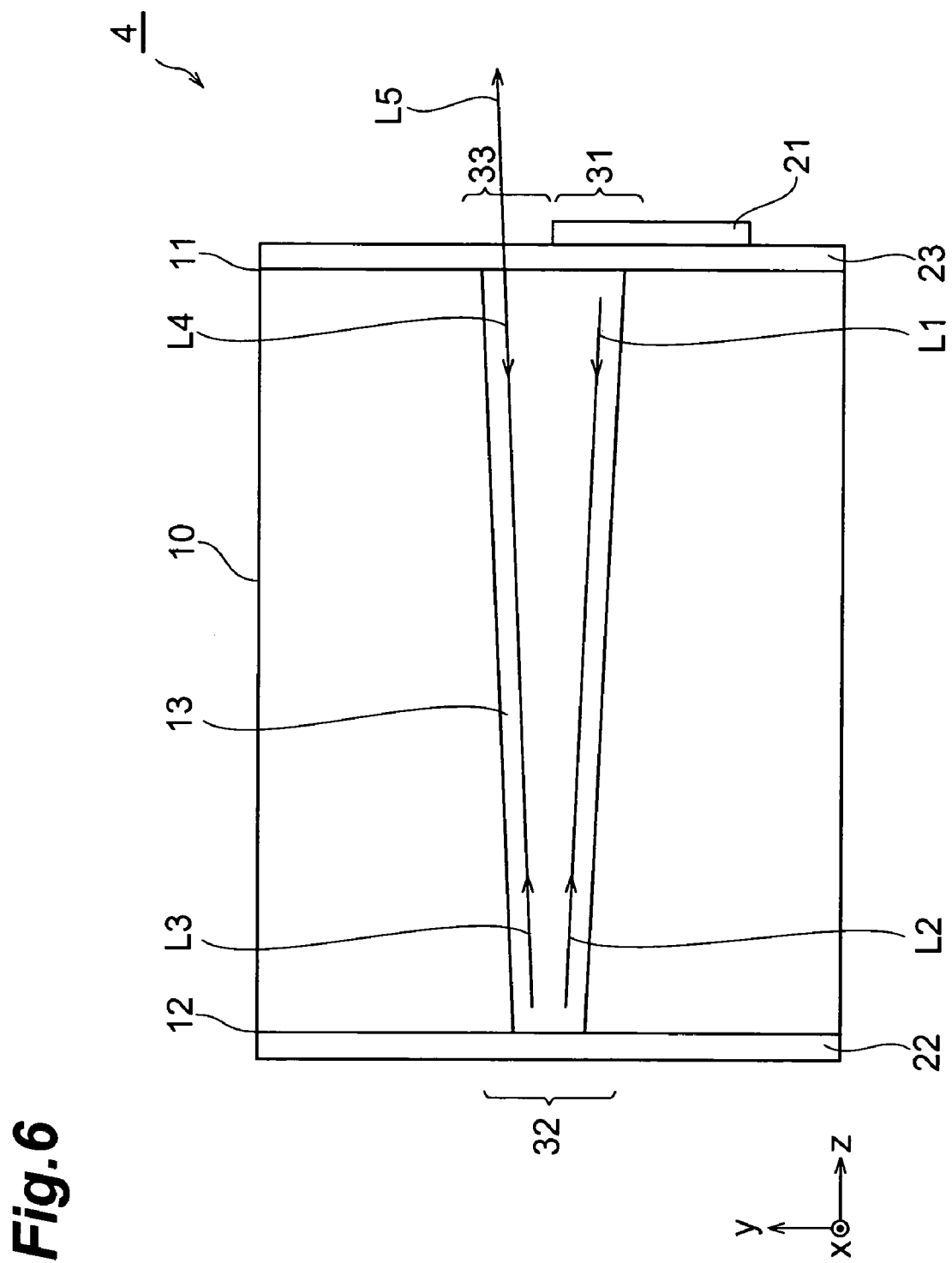
FIG. 6 is a cross-sectional view showing a construction of a fourth embodiment of the semiconductor laser apparatus according to the present invention.

A fourth embodiment of the semiconductor laser apparatus according to the present invention will be next explained below. FIG. 6 is a cross-sectional view showing a construction of the fourth embodiment of the semiconductor laser apparatus according to the present invention. Note that the appearance of a semiconductor laser apparatus 4 according to the fourth embodiment is similar to that of the semiconductor laser apparatus 1 according to the aforementioned first embodiment (see FIGS. 1 and 2).

As shown in FIG. 6, at a first end surface 11 a portion overlapping with an active region 13 in a first reflection film 21 constitutes a first total reflection region 31, while a portion not overlapping with the first reflection region 21 in a partial reflection film 23 constitutes a partial reflection region 33. At a second end surface 12 a portion overlapping with the active region 13 in a second reflection region 22 constitutes a second total reflection region 32.

At the semiconductor laser apparatus 4 according to the fourth embodiment, a thickness of the active region 13 in the x-axis direction is constant along the z-axis direction, while a width of the active region 13 in the y-axis direction is narrower on the side of the second end surface 12 rather than the side of the first end surface 11. Particularly, when this matter is geometrically considered, in a region of the active region 13 through which light reflected in the first total reflection region 31 at a reflection angle of zero degree, among the light reaches to the second total reflection region 32, passes, a width on the second end surface 12 side is narrower than that on the first end surface 11 side. In addition, when that matter is geometrically considered, in a region of the active region 13 through which light reflected in the partial reflection region 33 at a reflection angle of zero degree, among the light reaches to the second total reflection region 32, passes, a width on the second end surface 12 side is narrower than that on the first end surface 11 side. In these respects, there are some differences from the case of the first embodiment. The width of the active region 13 may change over the whole range along the z-axis direction, or may change in the only partial range along the z-axis direction.

A laser resonator is constituted between the first total reflection region 31 and partial reflection region 33 also in the semiconductor laser apparatus 4 also according to the fourth embodiment as well as the case of the first embodiment, and the second total reflection region 32 is positioned on the way of the corresponding resonance optical path. Thus, an induction emission is produced in the active region 13, and thereby the laser apparatus 4 carries out a laser oscillation. As a result, among the lights reached from the active region 13 to the partial reflection region 33, the lights transmitted through the partial reflection region 33 serves as an output laser beam.

The semiconductor laser apparatus 4 according to the fourth embodiment brings the following effects in addition to the similar effects to the case of the first embodiment. That is, in the semiconductor laser apparatus 4 according to the fourth embodiment, the active region 13 has the aforementioned cross-sectional shape, thereby suppressing vertical resonance between the first total reflection region 31 and second total reflection region 32, and further suppressing also vertical resonance between the partial reflection region 33 and second total reflection region 32. As a result, resonance between the first total reflection region 31 and partial reflection region 33 is produced efficiently. The power of the laser beam outputted from the partial reflection region 33 can be intensified. In addition, a spread angle of the laser beam outputted from the partial reflection region 33 toward the y-axis direction can be further reduced.

Fifth Embodiment

Figure 7:
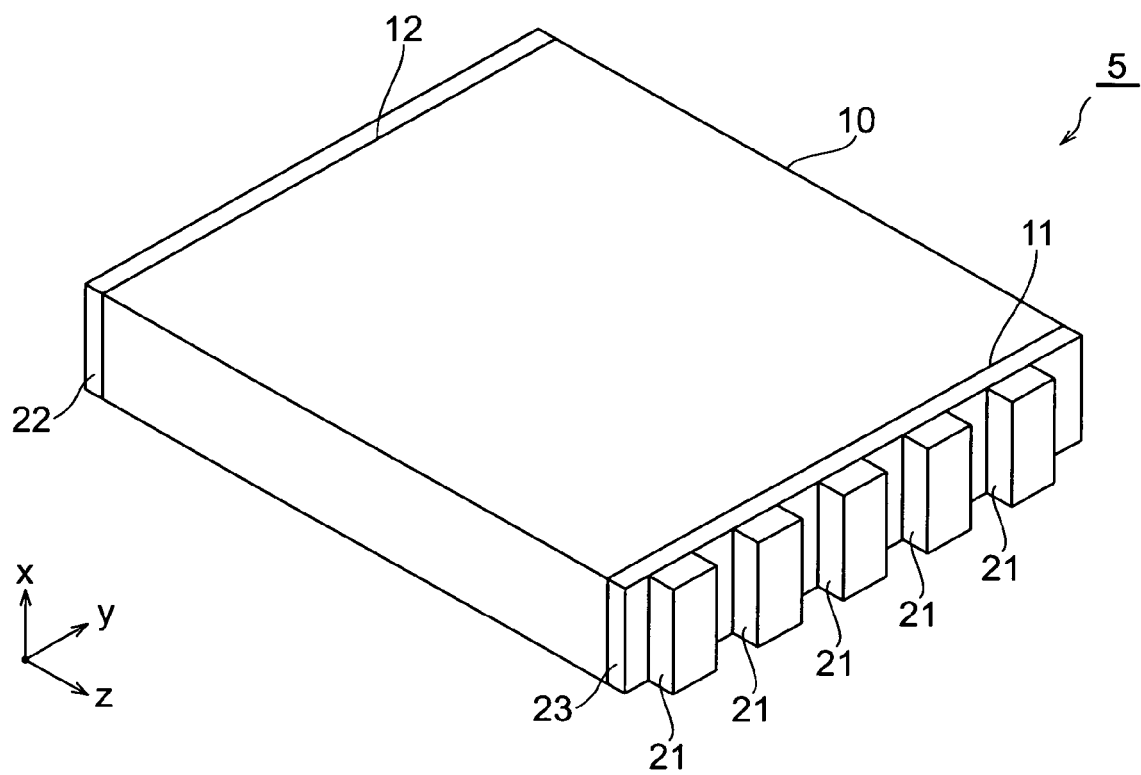
FIG. 7 is a perspective view showing a construction of a fifth embodiment of the semiconductor laser apparatus according to the present invention.
Figure 8:
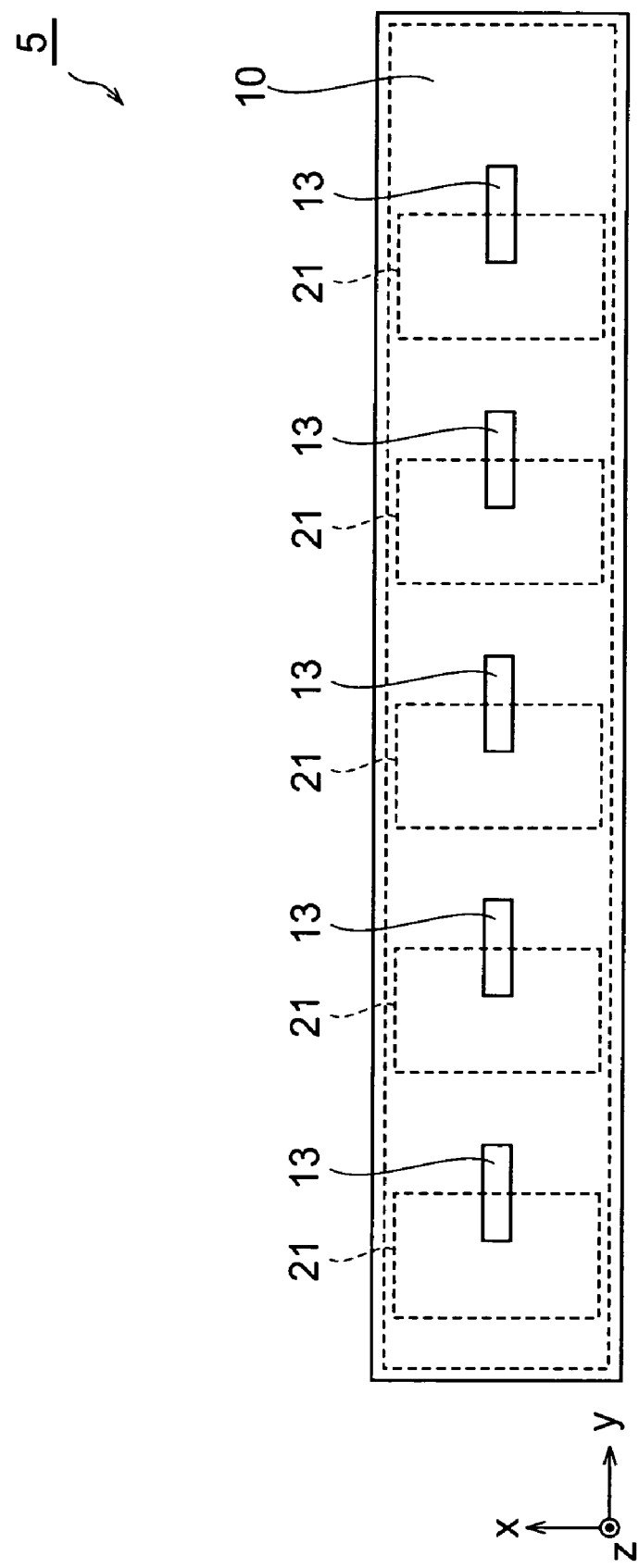
FIG. 8 is a front view showing the construction of the fifth embodiment of the semiconductor laser apparatus according to the present invention.

A fifth embodiment of the semiconductor laser apparatus according to the present invention will be next explained below. FIG. 7 is a perspective view showing a construction of the fifth embodiment of the semiconductor laser apparatus according to the present invention. FIG. 8 is a front view showing the construction of the fifth embodiment of the semiconductor laser apparatus according to the present invention. Additionally, FIG. 9 is a cross-sectional view showing the construction of the fifth embodiment of the semiconductor laser apparatus according to the present invention.

In the semiconductor laser apparatus 5 according to the present invention, a semiconductor light-emitting device 10 includes a plurality of active regions 13, and the plural active regions 13 are one-dimensionally disposed in an array to be capable of emitting light on the side of the same end surface. The semiconductor light-emitting device 10 has each active region 13 between a first end surface 11 and a second end surface 12 facing each other; a first reflection film 21 and a partial reflection film 23 are formed on the first end surface 11; a second reflection film 22 is formed on the second end surface 12. The first end surface 11 and second end surface 12 each are in parallel to the xy-plane. The first and second reflection films 21, 22 are total reflection films.

FIG. 8 is a front view of the semiconductor laser apparatus 5 as the first end surface 11 is seen along the z-axis direction. As shown in FIG. 8, the layers in the semiconductor light-emitting device 10 are stacked in the x-axis direction, and the plural active regions 13 are disposed in an array along the y-axis direction. The xy-section of each active region 13 has a shape longer in the y-axis direction than that in the x-axis direction. The partial reflection film 23 is formed to cover the whole surface and its periphery of the active region 13 on the end surface 11, and the first reflection film 21 is formed outside the partial reflection film 23 to cover part of the active region 13 on the end surface 11. The second reflection film 22 is formed to cover the whole surface and its periphery of each active region 13 on the end surface 12. These are composed of dielectric multilayer films. Or, the first reflection film 21 and second reflection film 22 each are composed of a metallic film. Each reflectance of the first reflection film 21 and second reflection film 22 that may totally reflect arrived light is 90% or more, preferably substantially 100%. The reflectance of the partial reflection film 23 is 3–15%.

Figure 9:
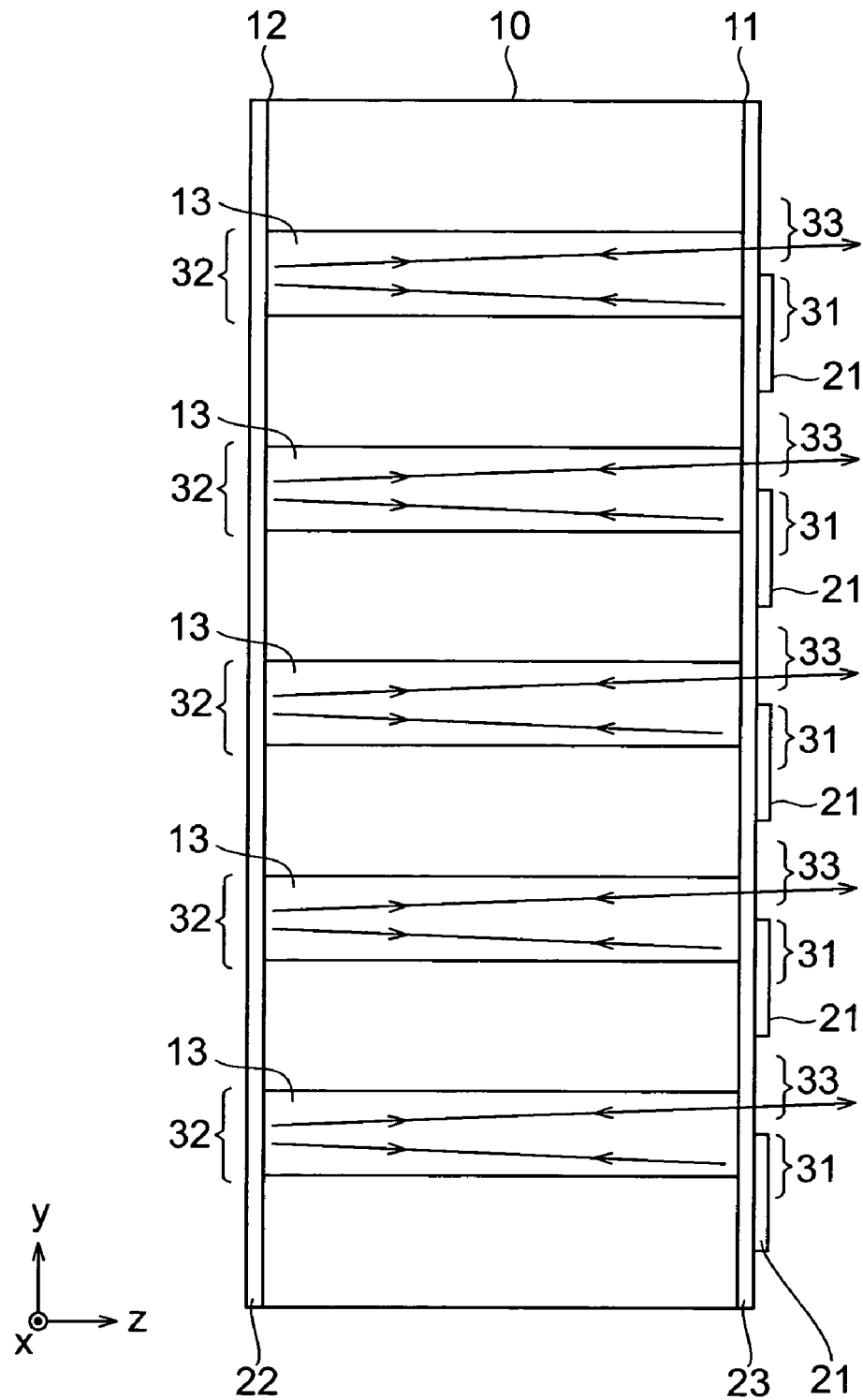
FIG. 9 is a cross-sectional view showing the construction of the fifth embodiment of the semiconductor laser apparatus according to the present invention.

FIG. 9 is a view showing a yz-section including the active region 13 of the semiconductor laser apparatus 5. As shown in FIG. 9, at the first end surface 11, a portion overlapping with each active region 13 in the first reflection film 21 constitutes a first total reflection region 31, while a portion not overlapping with the first reflection film 21 in the partial reflection film 23 constitutes a partial reflection region 33. At the second end surface 12, a portion overlapping with the active region 13 in the second reflection film 22 constitutes a second total reflection region 32. Also, in the laser apparatus 5 according to the fifth embodiment, a thickness of the active region 13 in the x-axis direction is constant along the z-axis direction, and a width of the active region 13 in the y-axis direction is also constant along the z-axis direction.

In the laser apparatus 5 according to the fifth embodiment, in each of the plural active regions disposed in an array, a laser resonator is constituted between the first total reflection region 31 and partial reflection region 33. Namely, light emitted within the active region 13 propagates in the active region 13, and then reaches the first total reflection region 31, second total reflection region 32, or partial reflection region 33. The light reaches from the active region 13 to the first total reflection region 31, and the light L1 reflected by the first total reflection region 31 reaches the second total reflection region 32 after propagation inside the active region 13. The lights L2, L3 reflected by the second total reflection region 32 reach the first total reflection region 31 or partial reflection region 33 after propagation inside the active region 13. Here, among the lights reached from inside the active region 13 to the partial reflection region 33, the light L4 reflected by the partial reflection region 33 reaches the second total reflection region 32 again after propagation in the active region 13, while the light L5 transmitted in the partial reflection region 33 is outputted outside the semiconductor laser apparatus 5.

In each active region 13 of the laser apparatus 5 according to the fifth embodiment, a laser resonator is also constituted between the first total reflection region 31 and partial reflection region 33, and the second total reflection region 32 is positioned on the way of the resonance optical path. Therefore, an induction emission is produced in the active region 13, and the laser apparatus 5 carries out a laser oscillation. As a result, the light transmitted in the partial reflection region 33 serves as an output laser beam among the lights reached from the active region 13 to the partial reflection region 33.

In the laser apparatus 5 according to the fifth embodiment, the laser beam outputted from the partial reflection region 33 has a certain spread angle. Among this, a spread angle in the y-axis direction is reduced ½ to ¼ as compared with that of the emission light from a conventional laser diode in the y-axis direction. In addition, the semiconductor laser apparatus 5 according to the fifth embodiment can output a laser beam having a small spread angle in the y-axis direction without using an optical element such as an optical path conversion element and/or a lens for collimating an emission light emitted from a laser diode, which enables downsizing. Further, when the size of the active region 13 is the same level as that of a conventional laser diode, the area of a laser-beam emitting portion (partial reflection region 33 at each active region 13 in the fifth embodiment) is narrower than that of the emitting portion of the conventional laser diode, resulting in enhancing the power density of the laser beam outputted from the semiconductor laser apparatus 5.

Furthermore, when a width of each partial reflection region 33 in the y-axis direction is set to 'a', and a array pitch of the plural active regions 13 in the y-axis direction is set to 'b', a ratio (a/b) is smaller than that of a conventional laser array; accordingly, when a laser beam outputted from each partial reflection region 33 is collimated through a microlens array, a collimate effect in the y-axis direction is improved. Namely, when a spread angle of an emission light in the y-axis direction is small, and further the ratio (a/b) is small, there is a long distance as far as the respective light beams outputted from the neighboring partial reflection regions 33 overlap with each other, which allows to employ a micro-lens array having a long focus distance. Therefore, a parallel level of the light collimated by the micro-lens array is excellent.

(Applications)

The present invention can be performed by a variety of modifications, not restricted to the aforementioned embodiments. For example, in the semiconductor laser 5 according to the aforementioned fifth embodiment, the active regions may have a similar shape to the active regions in the second to fourth embodiments.

In addition, in the semiconductor laser apparatus according to the fifth embodiment, though the plural active regions are one-dimensionally disposed in an array in the y-axis direction, the plural active regions may be arrayed in the x-axis direction and y-axis direction. In this case, a heat sink and a portion having a similar construction to those shown in FIGS. 7 and 8 are alternately stacked in the x-axis direction.

Figure 10:
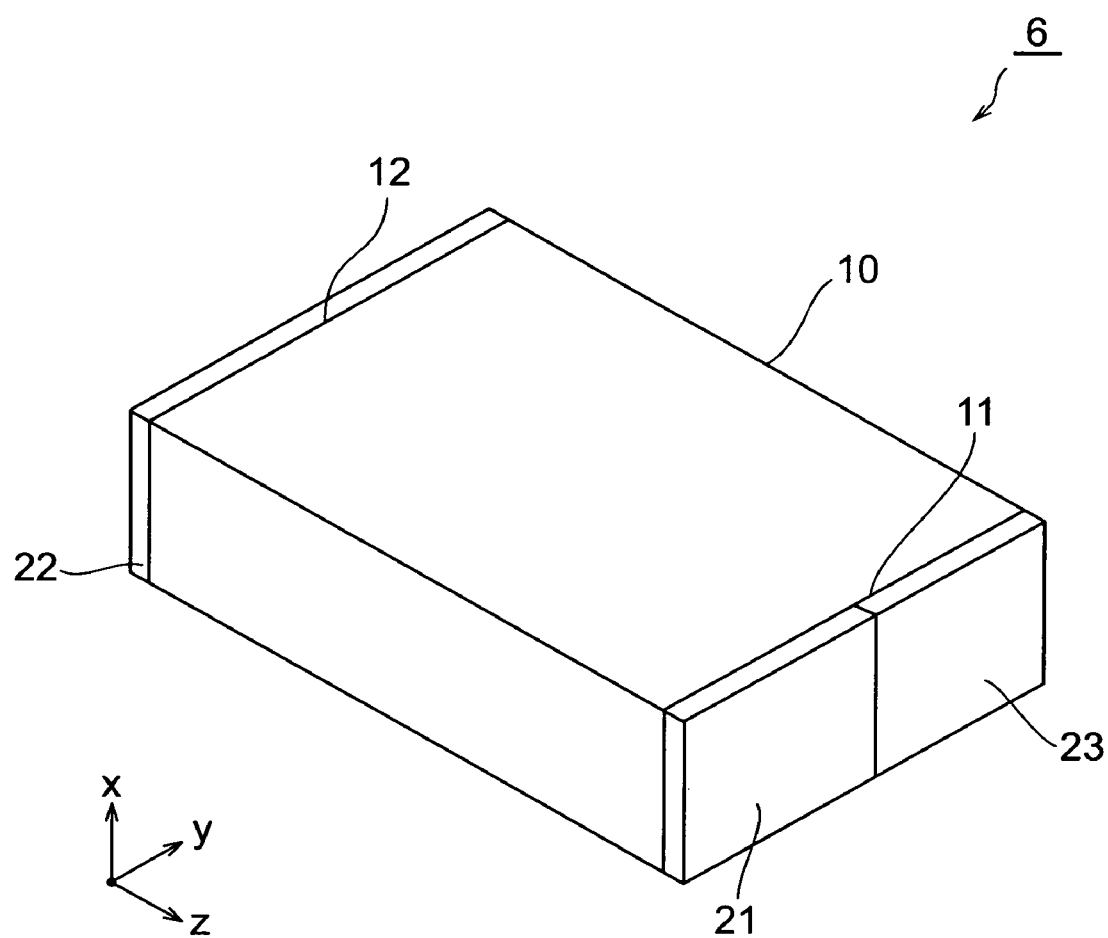
FIG. 10 is a perspective view showing a construction of an application of the semiconductor laser apparatus.
Figure 11:
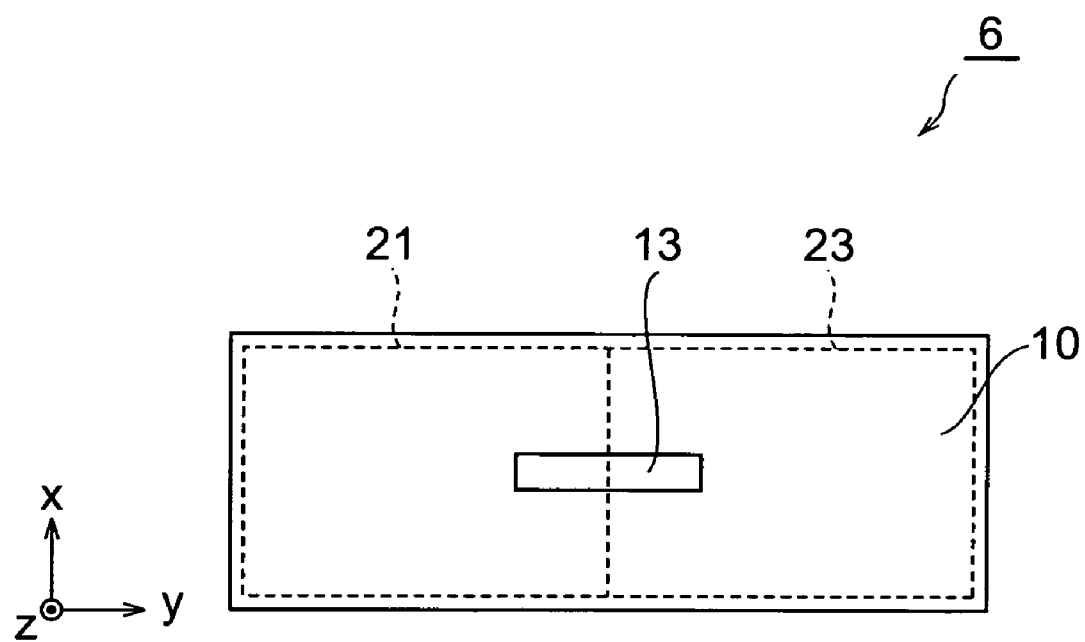
FIG. 11 is a front view showing the construction of the application of the semiconductor laser apparatus.

Further, in the aforementioned embodiments, the partial reflection film 23 are formed all over the end surface 11, and the first reflection film 21 is formed outside a part of the partial reflection film 23; however, the partial reflection film 23 don't need to be formed on one region corresponding to the first total reflection region 31. FIG. 10 is a perspective view showing a construction of an application of the semiconductor laser apparatus. FIG. 11 is a front view showing the construction of the application of the semiconductor laser apparatus. In the semiconductor laser apparatus 6 according to the application, the first reflection film 21 may be formed to cover part of the active region 13 on the first end surface 11, while the partial reflection film may be formed to cover the remainder of the active region 13 on the first end surface 11.

As described above, in accordance with the semiconductor laser apparatus of the present invention, a spread angle of the emission light can be reduced, and downsizing can be performed.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor laser apparatus comprising:
a first end surface and a second end surface facing each other;
an active region for emitting light having a predetermined wavelength, said active region positioned between said first and second end surfaces and extending along a first direction;
a first reflection structure provided on the first end surface side, said first reflection structure totally reflecting light having propagated through said active region;
a partial reflection structure provided on the first end surface side and constituting a laser resonator together with said first reflection region, said partial reflection structure transmitting part of the light having propagated through said active region and reflecting the remainder thereof, wherein an end surface of said active region corresponding with said first end surface is divided into a total reflection region and a partial reflection region not overlapping with each other in combination with said first reflection structure and said partial reflection structure; and
a second reflection structure provided on the second end surface side to be positioned on the way of a resonance optical path of the laser resonator constituted by said first reflection structure and said partial reflection structure, said second reflection structure totally reflecting the light having propagated through said active region.

2. A semiconductor laser apparatus according to claim 1, wherein the end surface of said active region corresponding with said first end surface has a shape such that a width of a second direction orthogonal to the first direction is longer than that of a third direction orthogonal to both the first direction and the second direction, and
wherein said total reflection region and said partial reflection region are arranged along the second direction.

3. A semiconductor laser apparatus according to claim 1, wherein the end surface of said active region corresponding with said first end surface is wider than an end surface of said active region corresponding to said second end surface.

4. A semiconductor laser apparatus according to claim 3, wherein a section orthogonal to the first direction in said active region narrows from said first end surface toward said second end surface.

5. A semiconductor laser apparatus according to claim 3, wherein in a region of said active region through which light totally reflected at a reflection angle of zero degree by said first reflection structure, among the light reaches to said second reflection structure, passes, said region has a shape such that a sectional area on the second end surface side is narrower than that on the first end surface side.

6. A semiconductor laser apparatus according to claim 3, wherein in a region of said active region through which light reflected at a reflection angle of zero degree by said partial reflection structure, among the light reaches to said second reflection structure, passes, said region has a shape such that a sectional area on the second end surface side is narrower than that on the first end surface side.

7. A semiconductor laser apparatus according to claim 1, wherein said active region is constituted by a plurality of waveguide regions each emitting light having a predetermined wavelength and extending along said first direction,
wherein an end surface of each of said waveguide regions, corresponding with said first end surface, is divided into a total reflection region and a partial reflection region in combination with said first reflection structure and said partial reflection structure, and
wherein said waveguide regions are one-dimensionally disposed in an array so that these end surfaces are aligned along the second direction.

8. A semiconductor laser apparatus according to claim 1, wherein said active region is constituted by a plurality of waveguide regions each emitting light having a predetermined wavelength and extending along the first direction,
wherein an end surface of each of said waveguide regions, corresponding with said first end surface, is divided into a total reflection region and a partial reflection region in combination with said first reflection structure and said partial reflection structure, and
wherein said waveguide regions are two-dimensionally arranged in an array so that these end surfaces are aligned along the second direction and stacked along the third direction.

* * * * *